United States Patent [19]

Sato et al.

[11] 4,456,917
[45] Jun. 26, 1984

[54] VARIABLE CAPACITOR

[75] Inventors: Yasuo Sato; Takamasa Sakai, both of Tokyo, Japan

[73] Assignee: Clarion Co., Ltd., Tokyo, Japan

[21] Appl. No.: 331,573

[22] Filed: Dec. 17, 1981

[30] Foreign Application Priority Data

Dec. 18, 1980 [JP] Japan .................................. 55-180059

[51] Int. Cl.³ .................................................. H01L 29/92
[52] U.S. Cl. ...................................... 357/14; 357/15; 357/23.6; 357/51
[58] Field of Search .............. 357/14, 51, 15 M, 15 R, 357/23 C

[56] References Cited

U.S. PATENT DOCUMENTS

| | | | |
|---|---|---|---|
| 3,657,609 | 4/1972 | Oswald et al. | 357/14 |
| 3,808,472 | 4/1974 | Engeler | 357/23 |
| 3,860,945 | 1/1975 | Dawson | 357/14 |
| 3,890,631 | 6/1975 | Tiemann | 357/23 C X |
| 3,890,635 | 6/1975 | Engeler | 357/23 C X |
| 4,216,451 | 8/1980 | Nishimura et al. | 357/51 X |

*Primary Examiner*—Martin H. Edlow
*Assistant Examiner*—William A. Mintel
*Attorney, Agent, or Firm*—Wallenstein, Wagner, Hattis, Strampel & Aubel

[57] ABSTRACT

A variable capacitor comprising a plurality of variable capacitor elements each having depletion layer control sections and a capacity reading section formed on a semiconductor substrate so that the capacity appearing at each capacity reading section varies in response to the bias voltage applied to the depletion layer control sections, particularly characterized in that respective capacities appearing at the capacity reading sections are also varied due to the difference of distances between the depletion layer control sections and the capacity reading sections.

9 Claims, 9 Drawing Figures

VARIABLE CAPACITOR

BACKGROUND OF THE INVENTION

1. Field of the Invention

This invention relates to a variable capacitor so arranged to precisely control the capacity variation in a wide range.

2. Description of the Prior Art

Conventionally, a PN junction element as shown in FIG. 1 has generally been used as a variable capacitor. In the same figure, the reference numeral 1 denotes an N-type semiconductor region, 2 a P-type semiconductor region, 3 a PN junction, 4 and 5 ohmic electrodes provided in the regions 1 and 2, respectively, 6 and 7 being lead terminals provided to the electrodes 4 and 5, respectively, and 8 represents a depletion layer.

With this arrangement, the depletion layer 8 grows and shrinks in response to bias voltage applied to the lead terminals 6 and 7, and the capacity variation thus caused is read out between them.

However, the conventional variable capacitor adopting such a PN junction element has the following drawbacks:

(1) Due to the fact that the conventional variable capacitor makes use of the increase or decrease of the depletion layer at the PN junction being dependent or the bias voltage, the minimum capacity is determined by impurity concentration in the semiconductor regions while the maximum usable capacity is determined by increase of conductance component. Therefore, it is practically impossible to permit a large variable range of the capacity and hold a large Q factor. Additionally, the larger the capacity variation the higher the Q factor becomes. Therefore, the covenional variable capacitor is attended by difficulties in designing the circuit.

(2) Due to the fact that supply of the bias voltage for varying the capacity and the reading of the capacity variation are performed by means of the common lead terminals, the capacitor is apt to cause undesired capacity variation in response to the input signal itself when the capacitor is adopted in a resonance circuit, for example, resulting in signal deterioration. Further, since it is is usually required that interference between the input signal voltage and the bias voltage be small, the conventional variable capacitor is restricted to a few uses.

(3) The impurity concentration in the semiconductor regions for determining the capacity of the depletion layer is set by such means as diffusion, ion implantation; etc. However, since such means cannot realize a good yield, integration in an integrated circuit is practically impossible.

OBJECT OF THE INVENTION

It is therefore an object of the present invention to solve such conventional drawbacks, and more specifically to provide a variable capacitor in which a varible capacitor element including a depletion layer control section and a capacity reading section is formed on a semiconductor substrate, and wherein the capacity appearing at the capacity reading section varies in accordance with the distance between the depletion layer control section and the capacity reading section.

SUMMARY OF THE INVENTION

In accordance with the present invention, there is provided a variable capacitor which comprises:

a semiconductor substrate;

a plurality of variable capacitor elements each having a depletion layer control section and a capacity reading section both formed on said substrate;

a bias voltage applying means for applying bias voltage to said depletion layer control section; and a variable voltage source for supplying said bias voltage, respective distances between said depletion layer control sections and said capacity reading sections being different from each other.

DETAILED DESCRIPTION OF THE PREFERRED EMBODIMENTS

Figure 1:
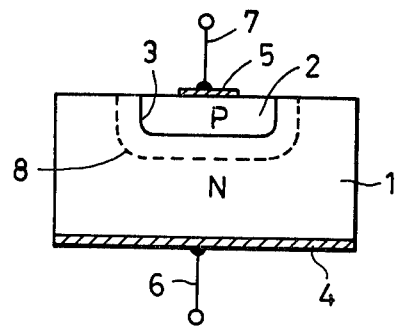
FIG. 1 shows a sectional view illustrating a conventional variable capacitor.

The present invention will now be described in detail referring to the preferred embodiments illustrated in the drawings.

Figure 2:
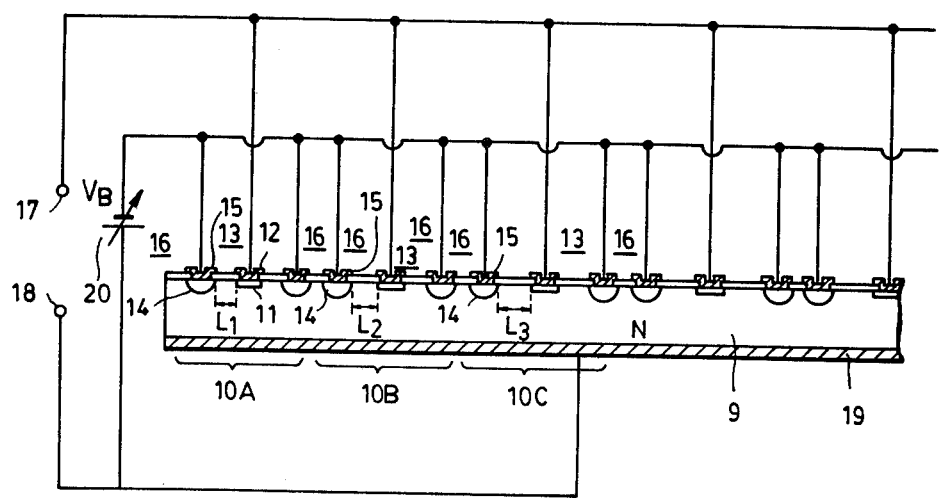
FIGS. 2, 5, 6 and 7 each shows a sectional view illustrating the preferred embodiment according to the present invention.

FIG. 2 shows a sectional view illustrating a variable capacitor as one embodiment according to the present invention, in which the reference numeral 9 denotes a semiconductor substrate such as an N-type silicon, for example, and each section 10A, 10B, 10C . . . is a variable capacitor element having a capacitor reading section 13 and a depletion layer control section 16. The capacity reading section 13 comprises a P-type region 11 provided in the N-type substrate 9 and a metallic electrode 12 provided in the P-type region 11, while the depletion layer control section 16 comprises at least one P-type region 14 provided adjacent to the P-type region 11 and a metallic electrode 15 provided in the P-type region 14. Distances $L_1$, $L_2$, $L_3$ . . . between respective capacity reading sections 13 and the depletion layer control sections 16 of the variable capacitor elements 10A, 10B, 10C . . . are arranged to differ from each other.

The reference symbol $V_B$ designates bias voltage which is commonly applied to the depletion layer control sections 16 of the variable capacitor elements 10A, 10B, 10C . . . from a variable voltage source 20, reference numeral 17 and 18 denote capacity reading terminals, and 19 is an ohmic electrode provided along the bottom surface of the semiconductor substrate 9.

Figure 3:
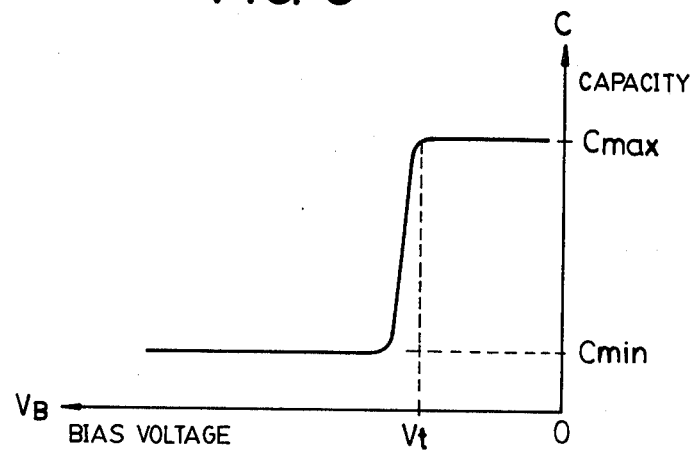
FIGS. 3 and 4 are graphs of a conventional C-V curve of a single junction and of a multiple junction system respectively for explaining the present invention.

With this arrangement, the characteristic of the capacity C of one of the variable capacitor elements with respect to the bias voltage $V_B$ appears as shown in FIG. 3. The capacity C is at the maxmum value $C_{max}$ when the bias voltage is zero or near zero. However, as the reverse bias voltage is slowly raised until representing a unique value $V_t$ (threshold value) of the element, the capacity C rapidly lowers to reach the minimum value $C_{min}$ and is thereafter kept in this condition. The threshold value $V_t$ varies in accordance with the distances $L_1$, $L_2$, $L_3$ . . . between the capacity reaading sections 13 and the depletion layer control sections 16 of the variable capacitor elements 10A, 10B, 10C . . . so that the larger the distance the larger it becomes.

Figure 4:
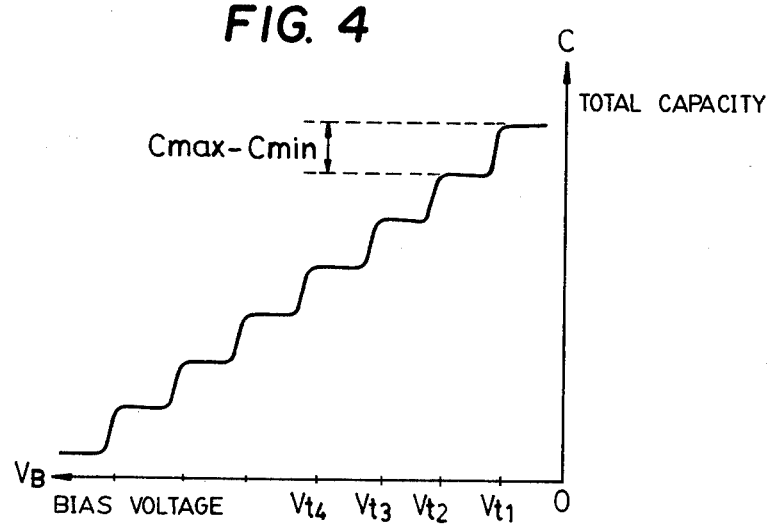

Therefore, when bias voltage is commonly applied to the variable capacitor elements having different threshold values which are integrated in parallel within the semiconductor substrate 9 as shown in FIG. 2, the total capacity characteristic appears to vary in a step-like manner as shown in FIG. 4 where respective characteristics as shown in FIG. 3 are continuously connected.

If the respective maximum capacity $C_{max}$ of the variable capacitor elements 10A, 10B, 10C . . . are held small and a plurality of the variable capacitor elements 10A, 10B, 10C are integrated, the widths of the steps in the characteristic of FIG. 4 becomes smaller thus obtaining a steep and accurate variation. Accordingly, the $C_{max}/C_{min}$ ratio can be held high and the total variation range of the capacity is made large. Further because for a given bias only some of the elements actuate substantially in response thereto within any give range while the others are held at $C_{max}$ or $C_{min}$, thereby maintaining a steady condition against variation of the bias voltage, the variation of the Q factor can be held small.

The characteristic of the total capacity C and the bias voltage $V_B$ can be set as desired by controlling the distances $L_1, L_2, L_3 \ldots$ between the capacity reading sections 13 and the depletion layer control sections 16 within the semiconductor substrate 9.

Figure 5:
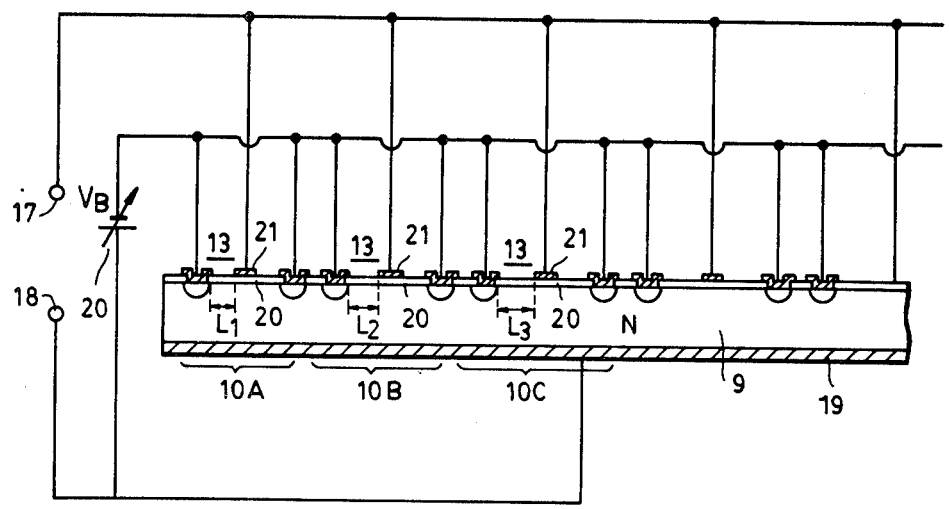

FIG. 5 shows another embodiment according to the present invention in which the capacity reading section 13 has a so-called MIS structure comprising insulating film 20 such as an oxide film, for example, formed on the semiconductor substrate 9 and an electrode provided on the insulating film.

Figure 6:
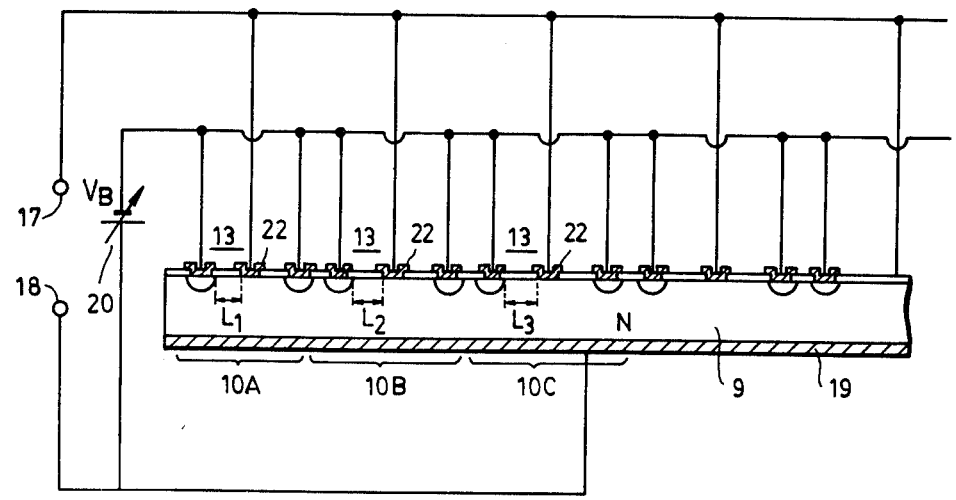

FIG. 6 shows a further embodiment according to the present invention in which the capacity reading section 13 has a so-called Schottky-barrier structure comprising a metal-semiconductor barrier formed between the semiconductor substrate 9 and a chosen metal 22 provided thereon.

As described above, the capacity reading section 13 may have a PN junction structure, MIS structure or Schottky-barrier structure. Also, the depletion layer control section 16, too, may have any one of those structures.

Further, when the sections 13 and 16 are arranged to form PN junctions in the semiconductor substrate therearound, any desired conductivity and type may be selected.

Figure 7:
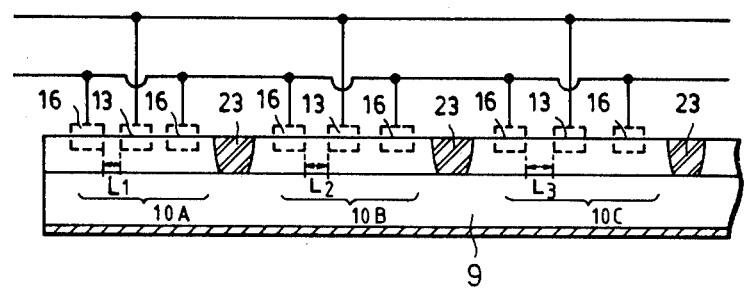

FIG. 7 illustrates a further embodiment according to the present invention where insulating regions 23 are formed between respective adjacent ones of the variable capacitor elements 10A, 10B, 10C . . . The insulating regions 23 may be formed by any insulating material such as an oxide film, glass, etc., or alternatively, may be constructed as an air isolation structure by providing vacant spaces.

By thus providing the insulated regions 23, electrical interference between respective adjacent elements such as variation of Q factor, for example, can be prevented.

Although the variable capacitor elements in the above-described embodiments are arranged to have different threshold values, they are not restricted to such an arrangement. For example, they may be classified into some groups so that the threshold values differ for respective groups.

Further, the elements need not be so disposed that the threshold values gradually and regularly vary along a given horizontal direction on the semiconductor substrate. Since the depletion layer control sections of respective elements are supplied in common with the same bias voltage, it is possible to always obtain the characteristic as shown in FIG. 4 where the capacity varies stepwise even if elements having different threshold values are disposed at random.

Figure 8:
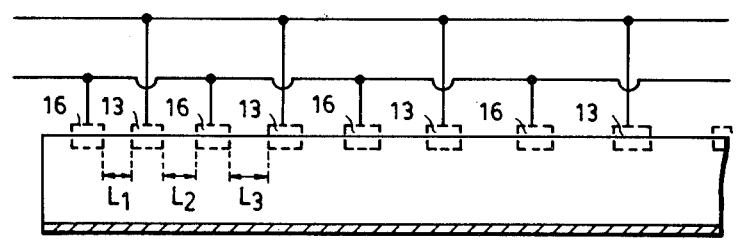
FIGS. 8(a) and (b) show a sectional view and a plan both illustrating a further embodiment according to the present invention.
Figure 8:
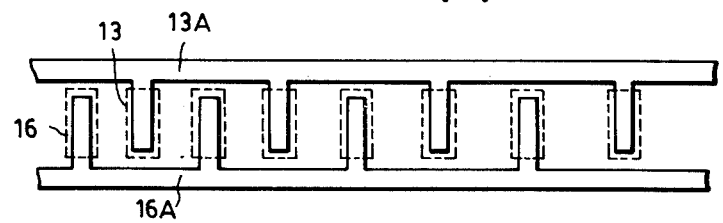

FIGS. 8(a) and (b) show a further embodiment according to the present invention illustrating a structure (FIG. 8a) where the depletion layer control sections 16 and the capacity reading sections 13 are alternately positioned, and FIG. 8b shows the electrode pattern thereof, the reference numerals 13A and 16A denoting the electrodes of the sections 13 and 16, respectively.

As apparent from the description, the present invention wherein a plurality of variable capacitance elements, each having depletion layer control sections and a capacity reading section, are so formed on a semiconductor substrate that the respective distances between the depletion layer control sections and the capacity reading sections differ from each other has the following properties:

(1) The capacity variation is precisely controlled over a wide range because the capacity variation characteristic with respect to bias voltage can be designed as desired.

(2) It is possible to hold the Q-factor variation small and still design the capacity variation range large.

(3) Capacity variation caused by the input signal itself is held small, resulting in substantially less signal deterioration because the bias voltage terminal and the capacity reading terminal are provided independently.

(4) A better yield can be expected because there is no need of providing ion implanation as an impurity control means.

(5) Being integrated on a substrate common to the semiconductor integrated circuit, the variable capacitor can be minimized in size and light in weight, thus contributing to reduction of the production cost.

It should be noted that in each case the distance between the depletion layer control section and the capacity reading section is that distance between the positions of those sections where they substantially begin to exert their influence on the semiconductor substrate.

We claim:

1. A variable capacitor comprising a semiconductor substrate having an ohmic contact thereto and a plurality of variable capacitor elements formed on said substrate, each said element including:

at least one control electrode disposed over the surface of said substrate for controlling the spatial extent of a depletion layer proximate thereto responsively to a control voltage applied thereto; and at least one capacitance sensing electrode disposed over the surface of said semiconductor surface proximate to at least one of said control electrodes so that variation of said control voltage over a given range causes the depletion layer associated therewith to encroach into the region of said sensing electrode to vary the capacitance associated therewith, the control electrode of each said element being connected in common with those of other elements, the corresponding capacitance sensing electrode of each said element being connected in common with those of said other elements, the separation between said control and sensing electrodes of at least some of the capacitor elements being different so that as said control voltage is increasingly applied said encroachment occurs in the various elements at differing values of said applied voltage.

2. The variable capacitor of claim 1 wherein there is further included an electrically insulating barrier interposed between said elements and extending into said substrate sufficiently to insulate the depletion layers associated with each said element from each other.

3. The variable capacitor of claim 1 or 2 wherein there is provided between said control electrode and the remainder of said substrate a localized region of doping in the surface of said substrate of a type opposite to the bulk of said substrate, said region being in electrical contact with said control electrode.

4. The variable capacitor of claim 1 or 2 wherein there is provided an insulating layer between said control electrode and said substrate to form a metal-insulator-semiconductor structure to control said depletion layer.

5. The variable capacitor of claim 1 or 2 wherein said control electrode forms a Schottky-barrier structure with said substrate.

6. The variable capacitor of claim 1 or 2 wherein there is provided between said sensing electrode and the remainder of said substrate a localized region of doping in the surface of said substrate of a type opposite to the bulk of said substrate, said region being in electrical contact with said sensing electrode.

7. The variable capacitor of claim 1 or 2 wherein there is provided an insulating layer between said sensing electrode and said substrate to form a metal-insulator-semiconductor capacitor.

8. The variable capacitor of claim 1 or 2 wherein said sensing electrode forms a Schottky-barrier structure with said substrate.

9. The variable capacitor of claim 1 wherein said elements are configured as an interdigitated array in which said sensing electrodes lie between said control electrodes so that each interior control electrode of the array controls the space charge encroachment to its adjacent sensing electrodes, the spacing between consecutive control electrodes being adjusted to differing values from one said element to the next to provide a chosen total capacitance variation of the capacitor as a function of said applied bias.

* * * * *